United States Patent
Shimizu

(10) Patent No.: US 9,443,571 B2
(45) Date of Patent: Sep. 13, 2016

(54) SEMICONDUCTOR MEMORY, MEMORY SYSTEM AND METHOD OF CONTROLLING SEMICONDUCTOR MEMORY

(71) Applicant: Naoki Shimizu, Seoul (KR)

(72) Inventor: Naoki Shimizu, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 13 days.

(21) Appl. No.: 14/644,152

(22) Filed: Mar. 10, 2015

(65) Prior Publication Data

US 2016/0064061 A1      Mar. 3, 2016

Related U.S. Application Data

(60) Provisional application No. 62/044,723, filed on Sep. 2, 2014.

(51) Int. Cl.
| | |
|---|---|
| *G11C 7/22* | (2006.01) |
| *G11C 7/12* | (2006.01) |
| *G11C 11/16* | (2006.01) |
| *G11C 29/52* | (2006.01) |
| *G11C 7/08* | (2006.01) |
| *G11C 29/04* | (2006.01) |

(52) U.S. Cl.
CPC .............. *G11C 11/1677* (2013.01); *G11C 7/12* (2013.01); *G11C 7/22* (2013.01); *G11C 11/1655* (2013.01); *G11C 11/1657* (2013.01); *G11C 11/1675* (2013.01); *G11C 11/1693* (2013.01); *G11C 29/52* (2013.01); *G11C 7/08* (2013.01); *G11C 2029/0411* (2013.01)

(58) Field of Classification Search
CPC ........ G11C 11/1693; G11C 7/08; G11C 7/12
USPC .................................................. 365/203, 200
See application file for complete search history.

(56) References Cited

U.S. PATENT DOCUMENTS

| | | | |
|---|---|---|---|
| 6,424,580 B1 * | 7/2002 | Frey .................... | G11C 7/12 365/191 |
| 2013/0042047 A1 | 2/2013 | Nishio | |
| 2013/0311717 A1 | 11/2013 | Kim et al. | |
| 2014/0016404 A1 | 1/2014 | Kim et al. | |
| 2014/0233335 A1 | 8/2014 | Nishio et al. | |

\* cited by examiner

*Primary Examiner* — Hoai V Ho
*Assistant Examiner* — Jay Radke
(74) *Attorney, Agent, or Firm* — Holtz, Holtz & Volek PC

(57) ABSTRACT

According to one embodiment, a semiconductor memory includes a memory area; an error detection circuit which detect an error of first data output from the memory area; and a control circuit which control the memory area and the error detection circuit. When the error is detected in the first data, the control circuit starts precharge of a bit line at a timing when a first period has elapsed from a start of a first operation of the memory area for output of the first data. When the error is not detected in the first data, the control circuit starts the precharge at a timing when a second period has elapsed from the start of the first operation, the second period is shorter than the first period.

20 Claims, 12 Drawing Sheets

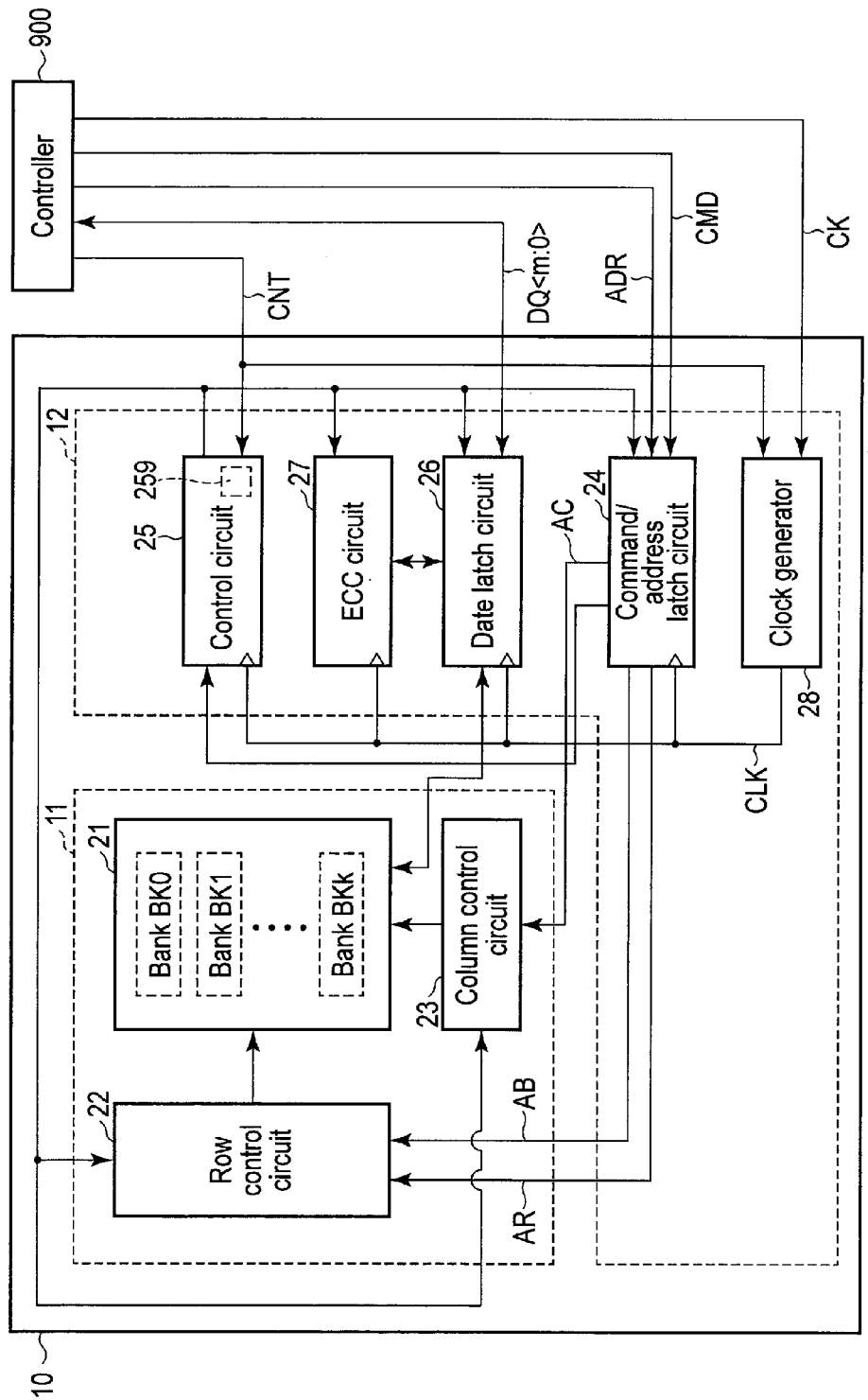
F I G. 2

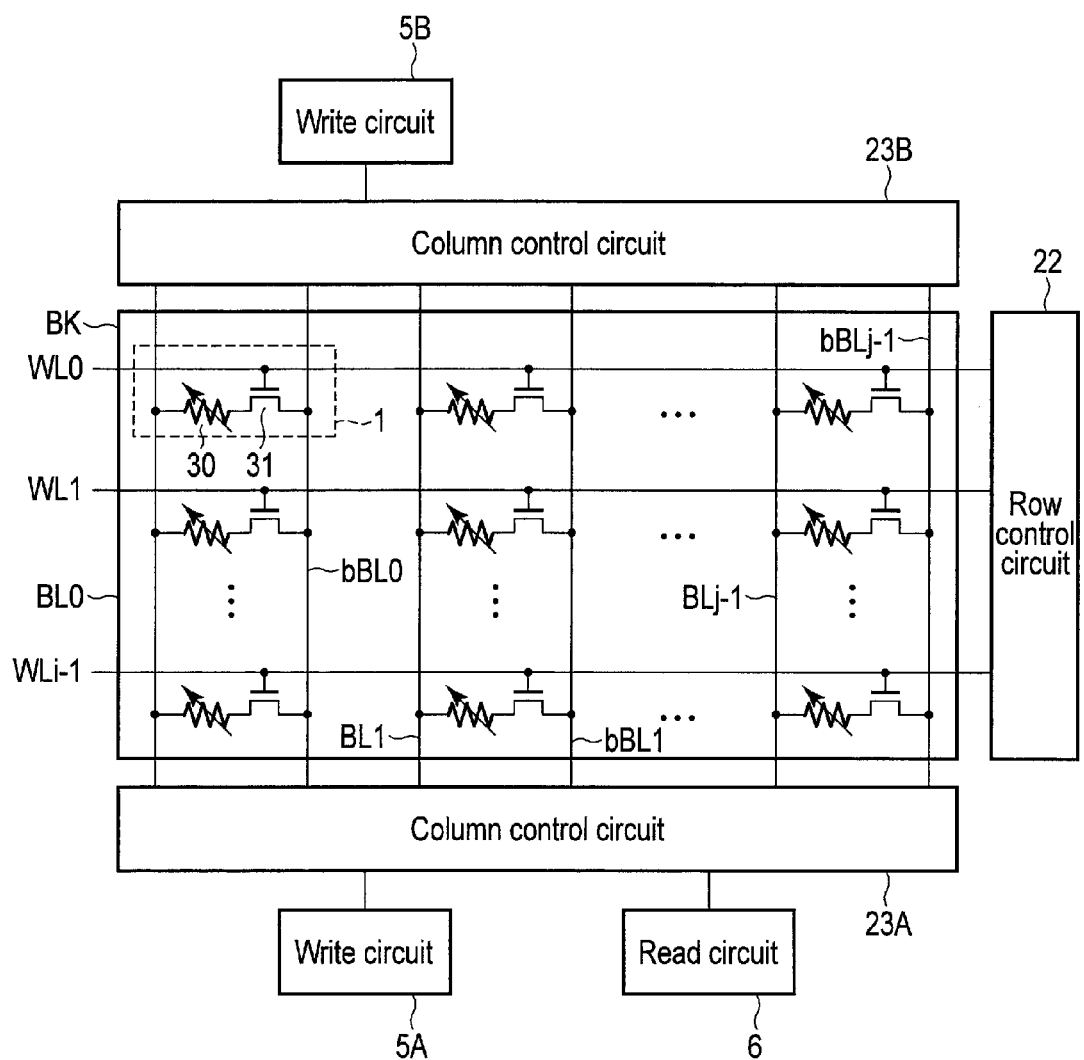
F I G. 3

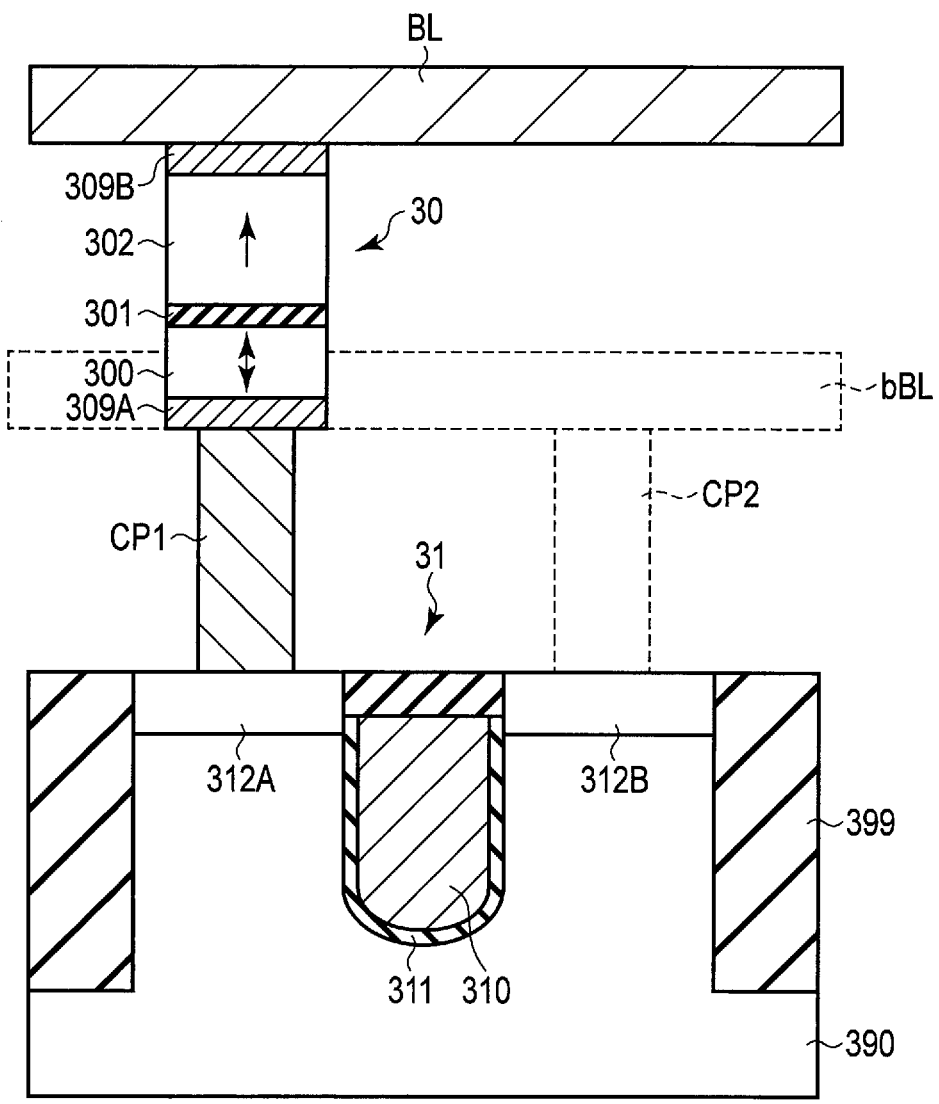
F I G. 4

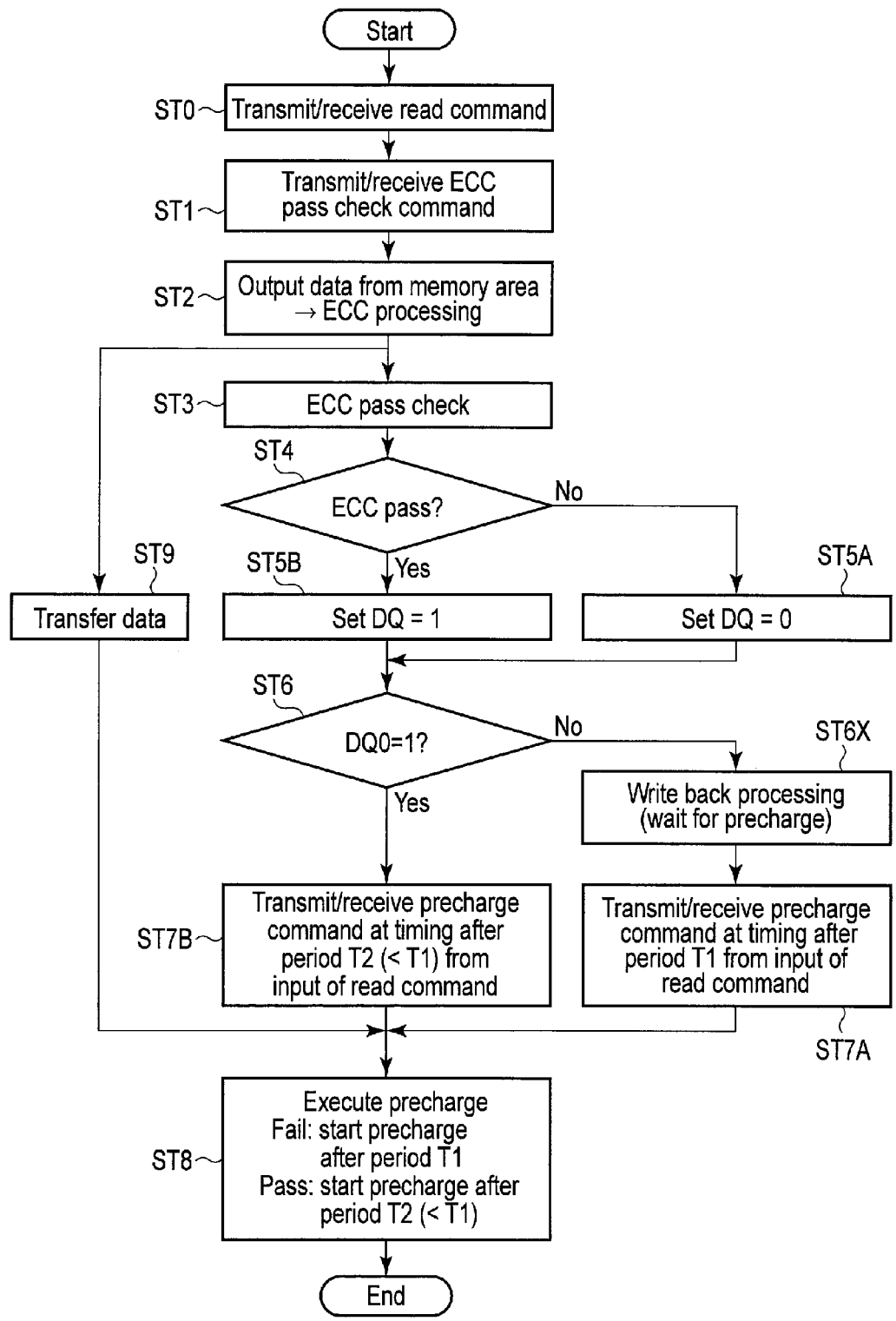
F I G. 5

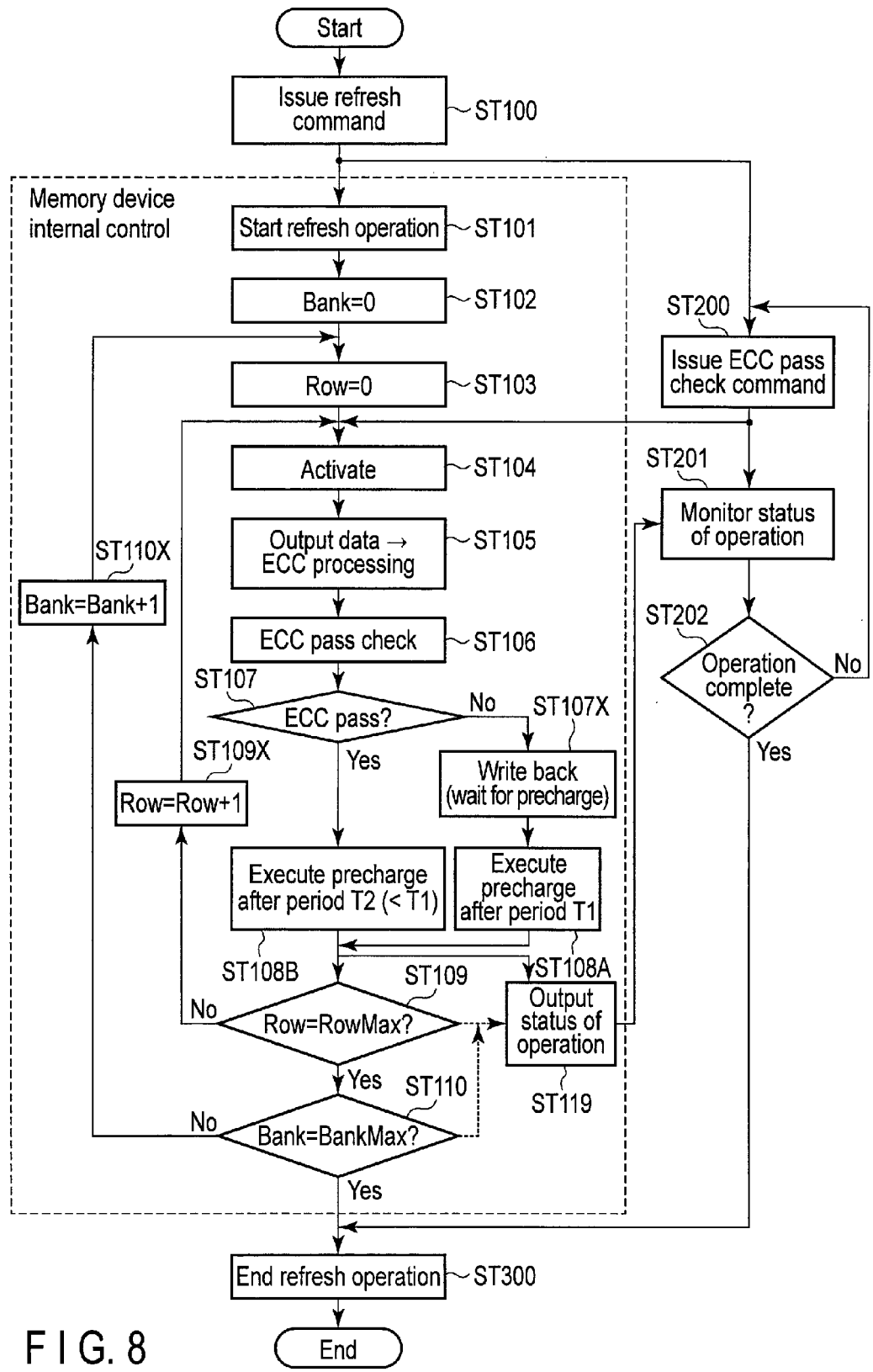
F I G. 8

| Memory command | Pins | | | | | | | | | | CK_t EDGE |
|---|---|---|---|---|---|---|---|---|---|---|---|
| | Pin0 | Pin1 | Pin2 | Pin3 | Pin4 | Pin5 | Pin6 | Pin7 | Pin8 | Pin9 | |
| Read (Bank) | H | L | H | RFU | RFU (H or L) | AC | AC | AB | AB | AB | ↑ |
| | AP | AC | AC | AC | AC | AC | AC | AC | AC | AC | ↓ | sPC

F I G. 9

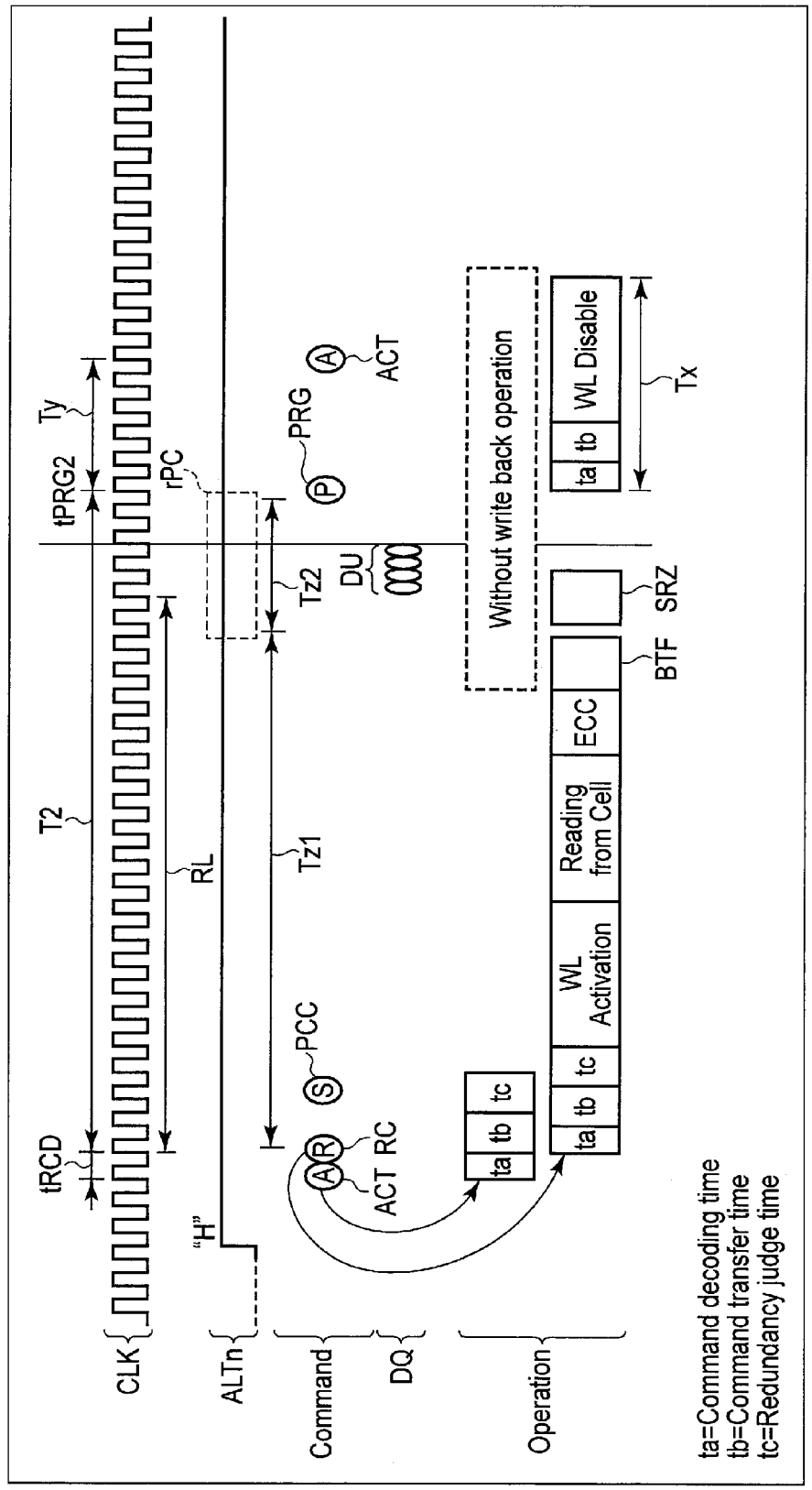
F I G. 11

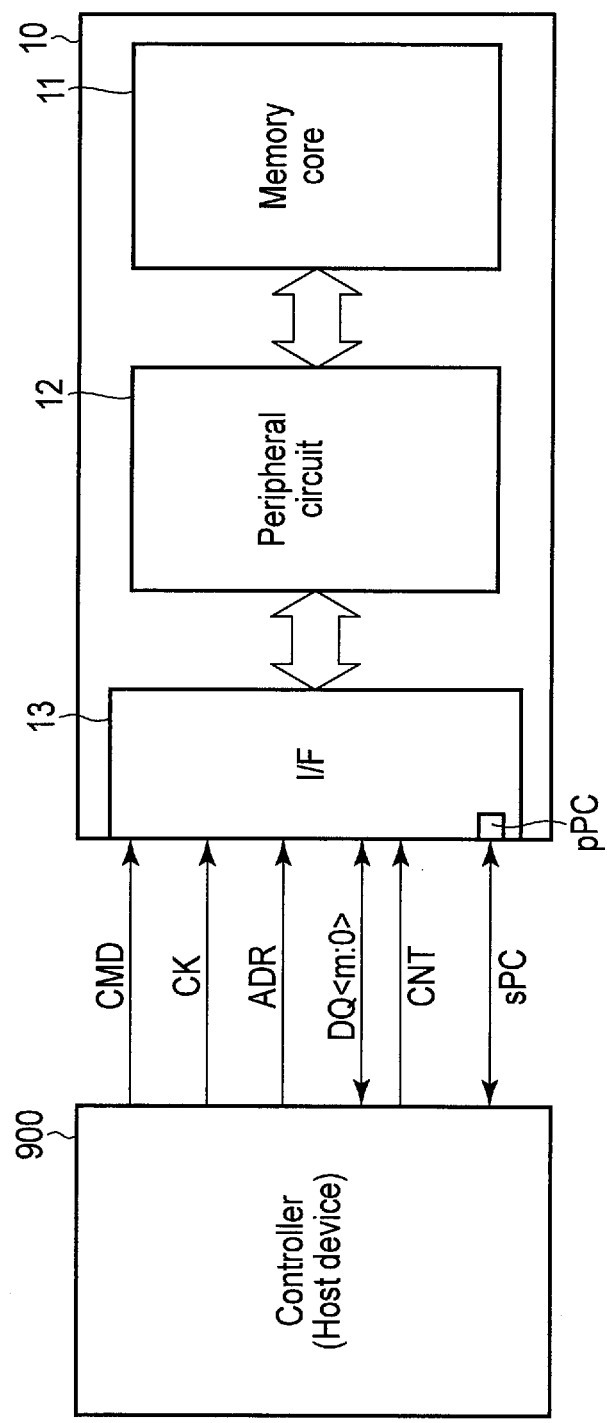
F I G. 12

SEMICONDUCTOR MEMORY, MEMORY SYSTEM AND METHOD OF CONTROLLING SEMICONDUCTOR MEMORY

CROSS-REFERENCE TO RELATED APPLICATIONS

This application claims the benefit of U.S. Provisional Application No. 62/044,723, filed Sep. 2, 2014, the entire contents of which are incorporated herein by reference.

FIELD

Embodiments described herein relate generally to a semiconductor memory, a memory system and a method of controlling a semiconductor memory.

BACKGROUND

Memory devices using magnetoresistive elements as memory elements have received attention as next-generation memory devices.

Research and development is underway on memory devices (for example, MRAMs) using magnetoresistive elements as alternate memories for volatile memories such as DRAMs and SRAMs. In this case, the MRAMs are preferably operated under the same specifications as the DRAMs and SRAMs from the viewpoint of development cost suppression and smooth replacement.

BRIEF DESCRIPTION OF THE DRAWINGS

FIG. 2 is a block diagram showing an example of the positions of internal components of the semiconductor memory;

FIG. 3 is a view showing an example of the internal arrangement of a memory cell array;

FIG. 4 is a sectional view showing an example of the structure of a memory cell;

FIG. 5 is a flowchart for explaining an example of the operation of a semiconductor memory according to the first embodiment;

FIG. 8 is a flowchart for explaining an example of the operation of a semiconductor memory according to the second embodiment;

FIG. 9 is a view for explaining an example of the operation of a semiconductor memory according to the third embodiment;

FIG. 11 is a timing chart for explaining an example of the operation of the semiconductor memory according to the fourth embodiment; and FIG. 12 is a block diagram for explaining a modification of the semiconductor memory according to the fourth embodiment.

DETAILED DESCRIPTION

Figure 1:
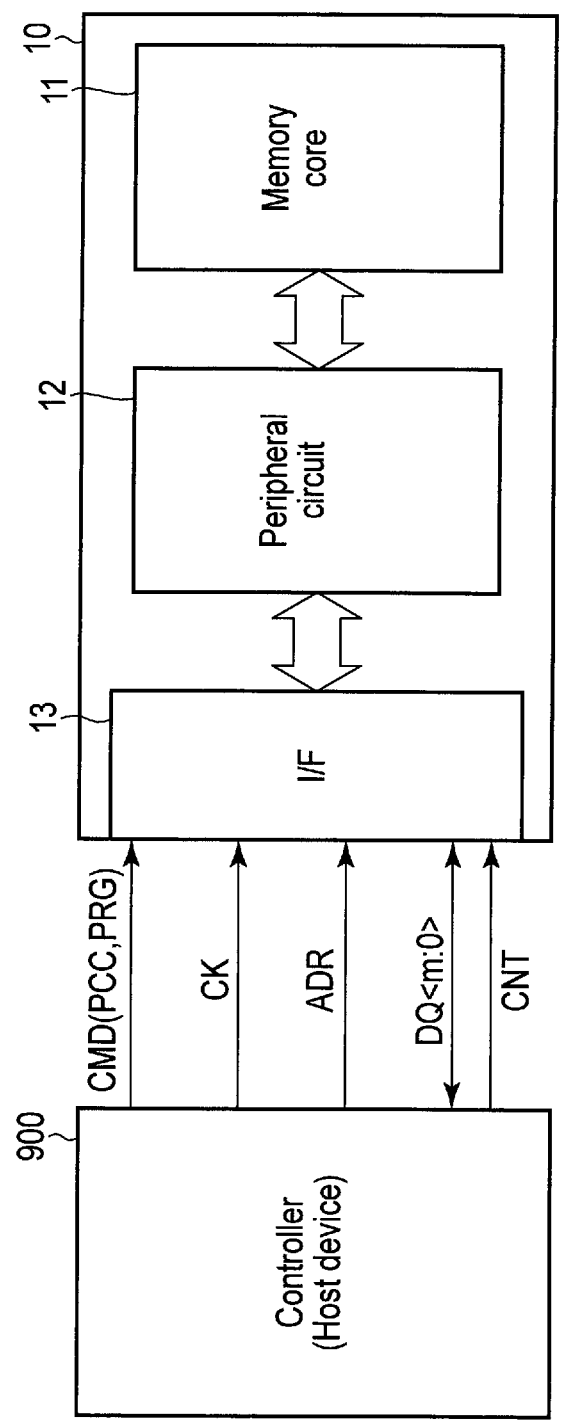
FIG. 1 is a schematic view of a semiconductor memory according to an embodiment.

In general, according to one embodiment, a semiconductor memory includes a memory area; an error detection circuit which detect an error of first data output from the memory area; and a control circuit which control operations of the memory area and the error detection circuit, wherein when the error is detected in the first data, the control circuit starts precharge of a bit line of the memory area at a timing when a first period has elapsed from a start of a first operation of the memory area for output of the first data, and when the error is not detected in the first data, the control circuit starts the precharge at a timing when a second period has elapsed from the start of the first operation, the second period is shorter than the first period.

The embodiments will now be described with reference to the accompanying drawings. Note that in the following description, the same reference numerals denote elements having the same functions and arrangements, and a repetitive description will be made only when necessary.

(1) First Embodiment

FIGS. 1 to 7 will be referred to for a description of a semiconductor memory according to the first embodiment and a memory system including the semiconductor memory.

(a) Overall Arrangement

FIG. 1 is a schematic view of a memory system including a semiconductor memory.

A memory system (storage device) according to this embodiment includes a semiconductor memory 10 and a controller 900.

The semiconductor memory 10 according to this embodiment is connected to the controller (host device) 900. Data is transferred between the semiconductor memory 10 and the controller 900.

The controller 900 issues a command (write command) to write data in the semiconductor memory 10 and a command (read command) to read out data from the semiconductor memory 10. The controller 900 issues a command (for example, active command or precharge command) to control the internal operation of the semiconductor memory 10.

The controller 900 supplies the address of a data write or data read target to the semiconductor memory 10.

The controller 900 supplies, to the semiconductor memory 10, a clock CK to control the operation timing of the semiconductor memory 10.

The controller 900 supplies, to the semiconductor memory 10, a control signal CNT to control the operation of the semiconductor memory 10. The control signal CNT includes, for example, a clock enable signal, a chip select signal and the like.

The controller 900 is, for example, an MPU (CPU) or a memory controller.

Based on a command CMD and the control signal CNT from the controller 900, the semiconductor memory 10 executes an operation requested by the controller 900.

The semiconductor memory 10 includes a memory core 11, a peripheral circuit 12, and an interface 13.

The memory core 11 includes a plurality of memory cells.

The peripheral circuit 12 performs internal control of the semiconductor memory 10 for an operation of writing or reading data in or from the memory core 11.

The interface 13 includes external connection terminals (not shown) such as a plurality of pads or a plurality of pins. The interface 13 receives data, the command CMD, the control signal CNT, the clock CK, and the like from the controller 900 via the external connection terminals (not shown). The interface 13 sends read data to the controller 900 and receives write data from the controller 900 via the external connection terminals.

The interface 13 is connected to the controller 900 by a plurality of control signal lines, a plurality of address lines, and a plurality of data lines DQ<m:0>. m is a natural number. The control signal lines are used to supply the control signal CNT and the command CMD. The address lines are used to transmit/receive addresses ADR. The data lines DQ<m:0> are used to transmit/receive data. The data lines DQ<m:0> will be referred to as data lines DQ without making a distinction.

FIG. 2 is a block diagram showing part of the internal arrangement of the semiconductor memory 10.

The memory core 11 includes at least a memory area 21, a row control circuit 22, and a column control circuit 23.

The memory area 21 includes (k+1) banks BK0 to BKk. k is a natural number. The banks BK0 to BKk can independently be activated. For example, only an operation target bank is activated at the time of read/write, thereby reducing the power consumption of the semiconductor memory. The plurality of banks BK0 to BKk will be referred to as banks BK without making a distinction.

The row control circuit 22 includes, for example, a row decoder. The row decoder decodes, for example, a bank address AB and a row address AR. The bank address AB is a signal used to select one of the plurality of banks BK0 to BKk. The row address AR is a signal used to select a row in the selected bank. For example, the row control circuit 22 further includes a switch circuit to select the row (for example, word line) represented by the address.

The column control circuit 23 includes, for example, a column decoder. The column decoder decodes, for example, a column address AC. The column address AC is a signal used to select a column (bit line) in the selected bank. For example, the column control circuit 23 further includes a switch circuit to select the column (for example, bit line) represented by the address.

The peripheral circuit 12 includes a command/address latch circuit 24, a control circuit 25, a data latch circuit 26, an error detection correction circuit (ECC circuit) 27, and a clock generator 28.

The command/address latch circuit 24 temporarily stores the command CMD and the addresses ADR supplied from the controller 900 via the control signal line and the address line. The command CMD is sent from the command/address latch circuit 24 to the control circuit 25. The bank address AB and the row address AR out of the addresses ADR are sent from the command/address latch circuit 24 to the row control circuit 22. The column address AC is sent from the command/address latch circuit 24 to the column control circuit 23.

The control circuit 25 controls the circuits of the semiconductor memory 10 based on the control signal CNT and the command CMD from the controller 900.

The data latch circuit 26 temporarily stores data from the controller 900 or data from the memory area 21. The data is transmitted/received between the controller 900 and the data latch circuit 26 via the data line DQ.

The ECC circuit 27 detects whether an error is included in data output from the memory area 21, and corrects the detected error. At the time of data write, the ECC circuit 27 generates a parity bit (error correction code) for data in the data latch circuit 26, which is to be written, and adds the parity bit to the data to be written. Data with the added parity bit is written in the memory area 21.

At the time of data read, the ECC circuit 27 performs ECC processing for data output from the memory area 21 to the data latch circuit 26. The ECC circuit 27 checks whether an error is included in the data from the memory area 21 (bank BK) by the ECC processing using a parity bit. If an error of the data is detected, the ECC circuit 27 corrects the detected error.

The semiconductor memory 10 according to this embodiment transfers the error-corrected data to the outside of the semiconductor memory 10 in response to a data read request and also writes it back into the memory area 21. In this embodiment, the processing (operation) of writing back data whose error has been corrected by ECC processing into the memory area 21 is called write back processing (or write back operation). For example, in the semiconductor memory 10 according to this embodiment, when no error is detected in data output from the memory area 21, the write back processing is not executed. By the write back processing, the reliability of data stored in the semiconductor memory 10 is ensured.

The clock generator 28 generates an internal clock CLK in the MRAM 10 based on the clock CK from the controller 900. The internal clock CLK is supplied to each circuit in the peripheral circuit 12. Each circuit in the peripheral circuit 12 is driven at an operation timing based on the internal clock CLK.

FIG. 3 is a view showing the internal circuit arrangement of one bank BK.

Each bank BK includes a memory cell array in which a plurality of memory cells MC are arranged in a matrix. A plurality of word lines WL0 to WLi−1 and a plurality of bit lines BL0 to BLj−1 and bBL0 to bBLj−1 are provided in the bank BK. In the following explanation, the word lines WL0 to WLi−1 will be referred to as word lines WL without making a distinction. The bit lines BL0 to BLj−1 will be referred to as bit lines BL without making a distinction. The bit lines bBL0 to bBLj−1 will be referred to as bit lines bBL without making a distinction.

The memory cells MC are connected between the bit lines BL and bBL. Activation of the memory cells MC is controlled by the word lines WL.

The plurality of memory cells MC arranged in the column direction are connected to the common bit lines BL and bBL. The plurality of memory cells MC arranged in the row direction are connected to the common word lines WL.

The bank BK (memory cell array) may have an internal arrangement of a layered bit line type and layered word line type.

For example, the semiconductor memory 10 according to this embodiment is a Spin transfer torque Magnetoresistive Random Access Memory (STT-MRAM).

A memory element 30 of the MRAM 10 is a magnetoresistive element.

The memory cell MC includes, for example, one magnetoresistive element 30 and one select switch 31.

The magnetoresistive element 30 is, for example, the MTJ (Magnetic Tunnel Junction) element 30.

The select switch 31 is, for example, a field effect transistor. The field effect transistor serving as the select switch 31 will be referred to as the select transistor (or cell transistor) 31 hereinafter.

One terminal of the MTJ element 30 is connected to the bit line BL, and the other terminal of the MTJ element 30 is connected to one end (source/drain) of the current path of the select transistor 31. The other end (drain/source) of the current path of the select transistor 31 is connected to the bit line bBL. The control terminal (gate) of the select transistor 31 is connected to the word line WL.

One end of the word line WL is connected to the row control circuit 22.

One end and the other end of the bit lines BL and bBL are connected to column control circuits 23A and 23B, respectively. Write circuits 5A and 5B are connected to the bit lines BL and bBL via the column control circuits 23A and 23B, respectively. In the MRAM 10, the write circuits 5A and 5B generate a write current to change the magnetic resistance (resistance value) of the MTJ element 30.

At the time of data write in the MTJ element 30, the write circuits 5A and 5B flow a write current flowing in a direction according to data to be written in a selected cell to the MTJ element 30 in the memory cell MC. That is, the write circuits 5A and 5B output a write current from the bit line BL to the bit line bBL or a write current from the bit line bBL to the bit line BL to the memory cell MC in accordance with data to be written in the MTJ element 30.

A read circuit 6 is connected to the bit lines BL and bBL via the column control circuit 23A. The read circuit 6 includes a sense amplifier that detects and amplifies a read signal, and the like. At the time of data read from the MTJ element 30, the read circuit 6 supplies a read current to a selected cell.

The read circuit 6 detects the variation amount (read signal or read output) of a current (or voltage) according to the magnitude of the resistance value of the MTJ element 30, and discriminates data stored in the MTJ element 30.

FIG. 4 is a sectional view showing an example of the structure of the memory cell MC. Referring to FIG. 4, members provided in the depth direction (or frontward direction) are indicated by broken lines.

The memory cell MC is formed in an active area (semiconductor area) AA of a semiconductor substrate 390. The active area is defined by an insulating film 399 buried in the element isolation area of the semiconductor substrate 390.

The surface of the semiconductor substrate 390 is covered with an interlayer insulating film (not shown).

The MTJ element 30 is provided in the interlayer insulating film. The MTJ element 30 includes at least a storage layer (also called a recording layer or magnetization free layer) 300, a reference layer (also called a pin layer, pinned layer, or magnetization invariable layer) 302, and a nonmagnetic layer (tunnel barrier layer) 301 between the storage layer 300 and the reference layer 302. Each of the storage layer 300 and the reference layer 302 is, for example, a magnetic layer having perpendicular magnetic anisotropy.

The direction of magnetization of the storage layer 300 is changed by the spin torque of the write current. The direction of magnetization of the reference layer 302 is not changed by the write current. The resistance value (magnetic resistance) of the MTJ element 30 is thus changed by the change in the relative magnetization alignments of the two magnetic layers 300 and 302. The direction of magnetization of the storage layer 300 may be changed unintentionally (without supply of the write current) by the influence of heat or a magnetic field applied to the MRAM. Stored data may be rewritten by such unintentional magnetization reversal of the storage layer 300. An error in data caused by the unintentional magnetization reversal of the storage layer is suppressed by ECC processing and write back processing.

The select transistor 31 is a field effect transistor having a buried gate structure.

A gate electrode 310 is buried in the active area between two source/drain diffusion layers 312A and 312B. A gate insulating film 311 is provided between the gate electrode 310 and the active area. The gate electrode 310 extends in the row direction and serves as the word line WL.

The select transistor 31 having the buried gate structure can increase the effective gate length (channel length) without increasing the planar size of the transistor. It is therefore possible to reduce the size of the memory cell MC and decrease the leakage current of the select transistor 31.

The select transistor 31 may be a field effect transistor having a planar structure or a FinFET.

The upper end of the MTJ element 30 is connected to the bit line BL via an upper electrode 309B. The lower end of the MTJ element 30 is connected to the source/drain diffusion layer 312A of the select transistor 31 via a lower electrode 309A and a contact plug CP1. The source/drain diffusion layer 312B of the select transistor 31 is connected to the bit line bBL via a contact plug CP2 provided in the depth direction (or frontward direction) in FIG. 4.

For example, the MRAM 10 according to this embodiment is controlled based on the JEDEC memory standard such as the LPDDR2 standard or the DDR4 standard.

As described above, when controlling the operation of the MRAM 10, the controller 900 generates and issues the write/read command CMD. For example, data transfer between the controller 900 and the MRAM 10 according to this embodiment is executed in a burst mode.

At the time of data write, the controller 900 transmits a write command to the MRAM 10. At the time of data read, the controller 900 transmits a read command to the MRAM 10.

In addition, the controller 900 transmits a precharge command PRG and an active command ACT to the MRAM 10.

The precharge command PRG is a command used to set the bank BK selected for the read or write operation in an initial state. The MRAM 10 charges at least one of the word line WL and the bit lines BL and bBL by the precharge command PRG. In a state in which the wires BL, bBL, and WL are precharged, the MRAM 10 according to this embodiment waits until issuance of the next command.

The active command ACT is a command used to activate a selected one of the plurality of word lines WL in the selected bank BK and enable data read/write from/in the bank BK.

In the memory system including the MRAM according to this s embodiment, the controller 900 generates and issues a command (to be referred to as an ECC pass check command or check command hereinafter) PCC that instructs the MRAM 10 to notify the controller 900 of the result (presence/absence of an error or correction) of ECC processing.

For example, at the time of data read, the controller 900 issues the ECC pass check command PCC to the MRAM 10.

The MRAM 10 according to this embodiment includes a circuit (to be referred to as an ECC pass check circuit hereinafter) 259 configured to analyze the ECC pass check command PCC and execute processing and an operation based on the ECC pass check command PCC. The ECC pass check circuit 259 is, for example, a logic circuit. The ECC pass check circuit 259 is provided in, for example, the control circuit 25. The control circuit 25 may have the function (for example, firmware) of executing ECC pass check processing.

The MRAM 10 according to this embodiment notifies the controller 900 of a determination result (check result) rPC of the presence/absence of data error/correction by ECC processing based on the command PCC.

For example, the MRAM 10 according to this embodiment transmits the ECC pass check result rPC to the controller 900 via the data line DQ.

Based on the ECC pass check command PCC, the MRAM 10 according to this embodiment can determine and control the presence/absence of execution of write back processing in accordance with the data error detection result by ECC processing.

The controller 900 issues the precharge command PRG to the MRAM 10 at a timing changeable according to the check result rPC (presence/absence of correction processing/write back processing) of ECC processing.

The MRAM 10 according to this embodiment can start and execute precharge of interconnects at a timing changeable according to supply of the precharge command PRG from the controller 900.

More specifically, the MRAM 10 according to this embodiment executes the write back operation and the precharge operation in the following way.

Upon detecting an error in data at the time of ECC processing (that is, when the ECC pass check result is fail), the MRAM 10 according to this embodiment executes write back processing based on the ECC pass check result.

The controller (MPU) 900 issues the precharge command PRG to the MRAM 10 at a timing when a first period T1 has elapsed from the input of a read command RC.

After write back processing, the MRAM 10 according to this embodiment executes the precharge operation based on the precharge command PRG. By the precharge operation, interconnects (for example, word lines WL and/or bit lines BL and bBL) in the bank BK of the MRAM 10 are charged.

When no error is detected in data at the time of ECC processing (that is, when the ECC pass check result is pass), the MRAM 10 according to this embodiment does not execute write back processing based on the ECC pass check result.

The controller 900 issues the precharge command PRG to the MRAM 10 at a timing when a second period T2 shorter than the first period T1 has elapsed.

When no error is detected in the data from the bank at the time of ECC processing, the MRAM 10 according to this embodiment immediately executes the precharge operation based on the precharge command supplied after the second period T2 (<T1) without executing write back processing.

When the write back function is not added to the MRAM 10, the MRAM 10 can execute the precharge based on the precharge command supplied after the second period T2 (<T1).

Hence, when write back processing is not executed, the MRAM and the memory system according to this embodiment can shorten the period from the start of data read to the start of precharge and speed up the operation of the semiconductor memory.

(b) Example of Operation

Figure 6:
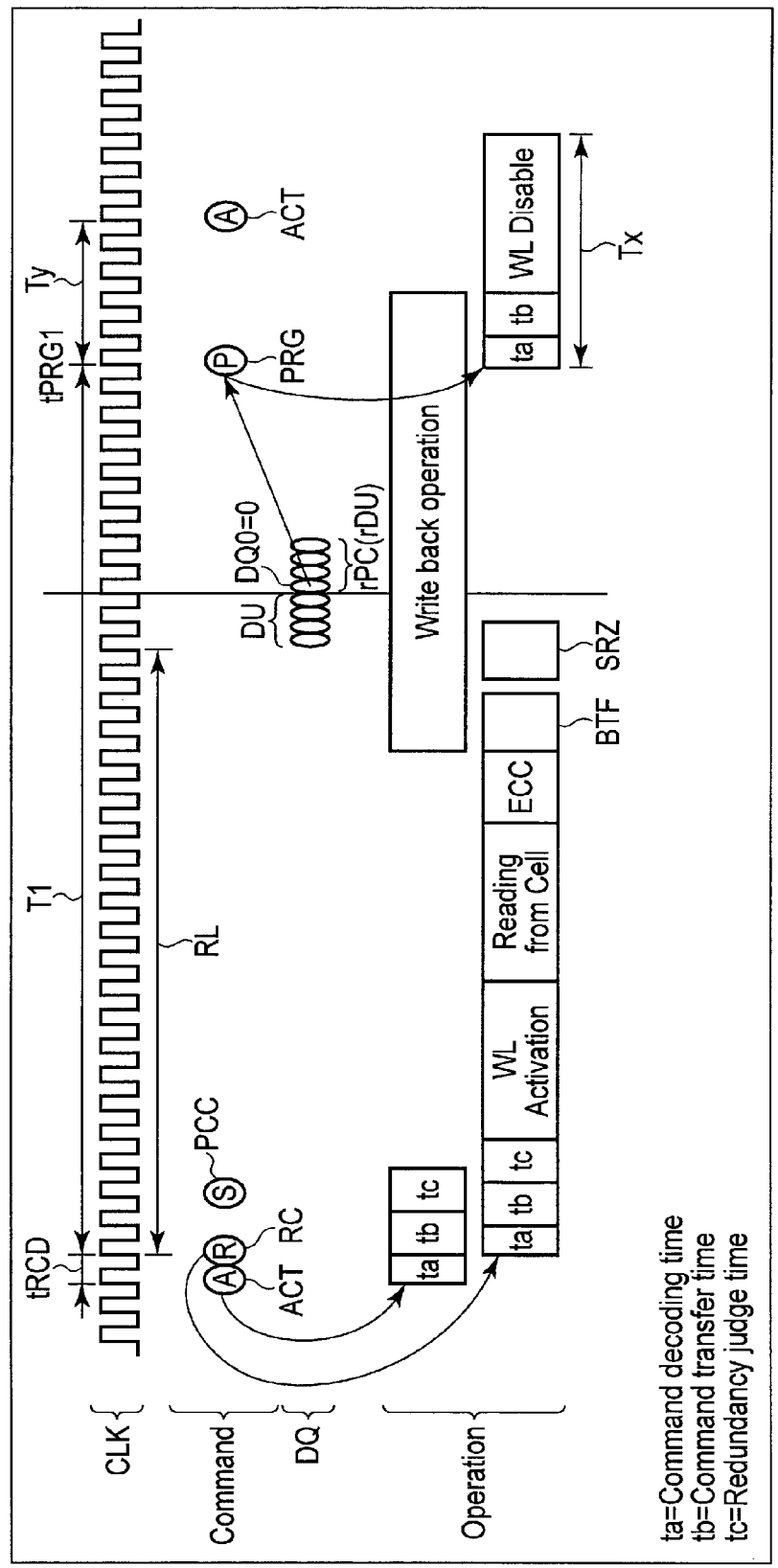
FIG. 6 is a timing chart for explaining an example of the operation of the semiconductor memory according to the first embodiment.
Figure 7:
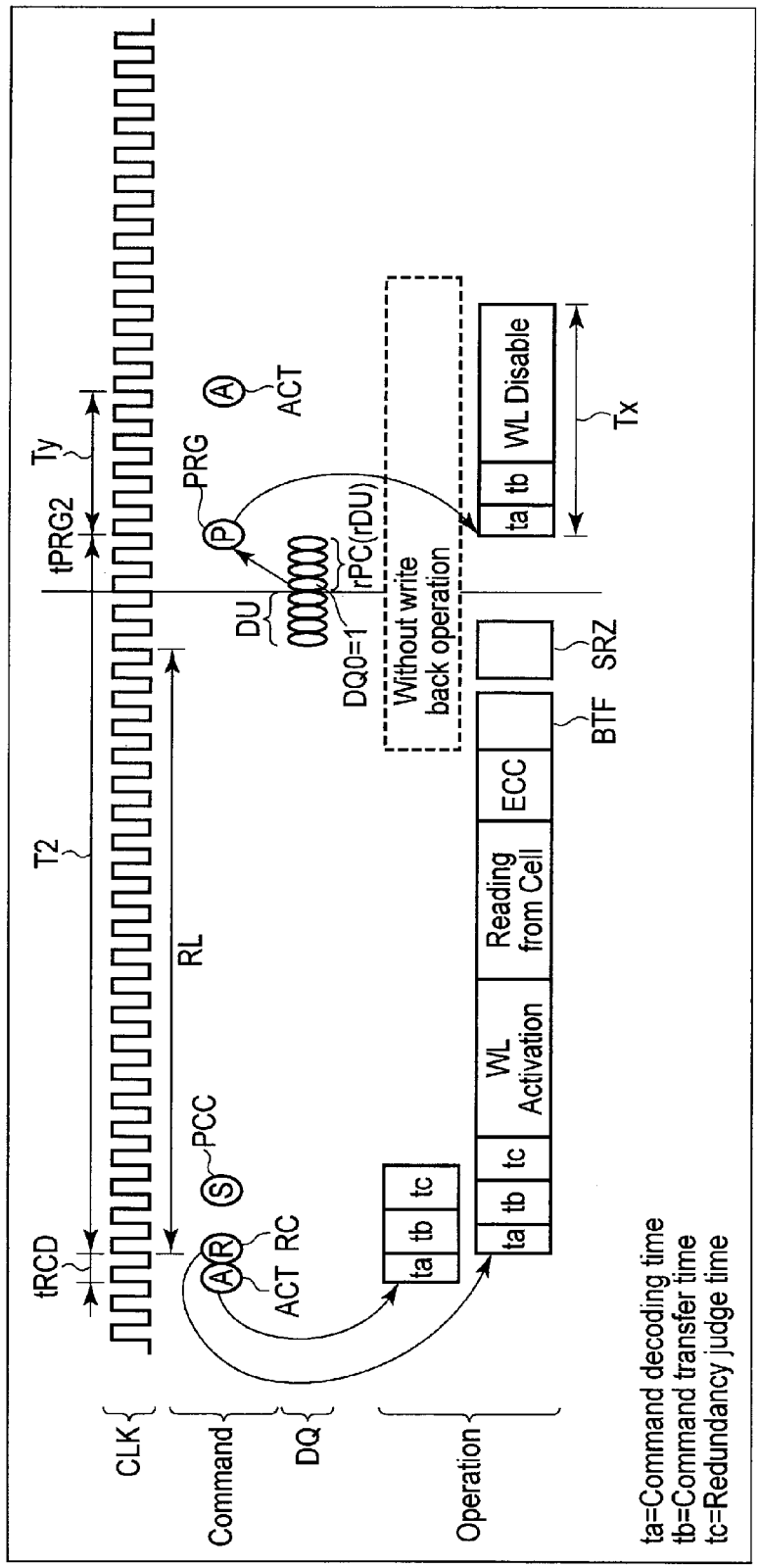
FIG. 7 is a timing chart for explaining an example of the operation of the semiconductor memory according to the first embodiment.

FIGS. 5 to 7 will be referred to for a description of the operation of the semiconductor memory according to the first embodiment and that of the memory system including the semiconductor memory according to this embodiment. In addition to FIGS. 5 to 7, FIGS. 1 to 4 will also be referred to for a description of the operation of the semiconductor memory according to this embodiment and that of the memory system including the semiconductor memory.

FIG. 5 is a flowchart for explaining an example of the operation of the semiconductor memory (for example, MRAM) according to this embodiment and the memory system including the semiconductor memory according to this embodiment. FIGS. 6 and 7 are schematic timing charts for explaining an example of the internal operation of the semiconductor memory according to this embodiment.

The operations of the MRAM and the memory system according to this embodiment will be described here by exemplifying data read.

As shown in FIG. 5, the controller 900 issues the read command RC to the MRAM 10 according to this embodiment to read data from the MRAM 10 based on a certain standard (for example, JEDEC memory standard) (step ST0). An address at which data to be read is stored is output to the MRAM 10 together with the read command RC. For example, the MRAM 10 has been activated by the active command ACT issued before the read command RC.

For example, after issuance of the read command RC, the controller 900 issues the ECC pass check command PCC to the MRAM 10 according to this embodiment (step ST1).

For example, the MRAM 10 receives the ECC pass check command PCC during the command determination time of the active command ACT or the read command RC. However, the ECC pass check command PCC can be received (transmitted) at any timing as long as it can reflect the result of ECC processing on the timing to start precharge.

As shown in FIGS. 6 and 7, the control circuit 25 of the MRAM 10 decodes, transfers, and determines each of the active command ACT and the read command RC.

The active operation is designated by the leading and trailing edges of the clock CLK when the active command ACT is input. In the active operation, a row address is input, and the selected address is set in the MRAM 10. The read operation RC (or write operation) is designated by the leading edge of the clock CLK when the read command RC (or write command) is input.

Note that tRCD (RAS to CAS delay) is a delay time from the reception of the active command ACT to the reception of the read command RC (or write command).

Each circuit in the MRAM 10 is driven under the control of the control circuit 25 based on the commands ACT and RC.

The MRAM 10 starts an internal operation for data read based on the read command RC. Data is output from the memory area 21, and the output data undergoes ECC processing (step ST2).

For example, the row control circuit 22 activates the word line (selected word line) WL corresponding to the row address. The column control circuit 23 activates the bit lines (selected bit lines) corresponding to the column address.

The read circuit 6 detects and amplifies a signal output from the memory cell MC to the bit lines BL and bBL, thereby determining the data of the memory cell MC. The read circuit 6 output the data of the memory cell MC to the data latch circuit 26.

The data from the bank BK is thus output to the data latch circuit 26.

The ECC circuit 27 performs ECC processing of the data output to the data latch circuit 26.

The ECC circuit 27 detects, based on a parity bit added to the data, whether the data includes an error. Upon detecting an error of data, the ECC circuit 27 corrects the error of the data output from the bank BK to the data latch circuit 26.

The data (data from the memory area 21) that has undergone the ECC processing undergoes transfer processing BTF to an output buffer (not shown) and then serialization processing SRZ. As described above, in the memory system according to this embodiment, data transfer between the MRAM and the controller is executed in a burst mode. For example, the burst length is set to "4".

For example, data from the bank BK may be output to the data line DQ assigned the same number as the number assigned to the bank BK.

Data DU based on the read command RC is transferred from the MRAM 10 to the controller 900 (step ST9). The data unit DU of a predetermined burst length (4 bits here)

output from the memory area 21 is output to the data line DQ with a predetermined read latency RL. Note that the read latency RL is a period from the start of the read operation to the data output to the local interface of the MRAM 10.

By processing parallel to the data transfer, the control circuit 25 checks the result of ECC processing based on the ECC pass check command PCC (step ST3).

The control circuit 25 notifies the controller 900 of the ECC pass check result rPC, that is, the determination result of the presence/absence of data error (presence/absence of error correction) by ECC processing (step ST4).

For example, the ECC pass check result rPC is output to the controller 900 via the data line DQ next to the read data DU corresponding to the check result rPC.

When executing data transfer in the burst mode, the ECC pass check result (to be also referred to as pass check data or pass check information hereinafter) rPC is output as the data unit DU including a plurality of bits.

For example, when the burst length is 4, a 4-bit data unit rDU is transferred from the MRAM 10 to the controller 900 as the check result rPC of ECC processing.

The check result rPC output in the burst mode is output to the outside of the MRAM 10 using, for example, the first to fourth data lines DQ0, DQ1, DQ2, and DQ3.

Whether the ECC pass check results in fail (error exists) or pass (no error exists) is notified to the controller 900 by setting, out of the four bits including the check result rPC, data (1-bit signal level) on the data line DQ0 to "1" or "0". The bits on the remaining three data lines DQ1, DQ2, and DQ3 can be set to either "1" or "0".

Note that even when executing data transfer in the burst mode, a 1-bit signal may be transferred from the MRAM 10 to the controller 900 as the ECC pass check result rPC. The ECC pass check result rPC may be output from the MRAM 10 to the controller 900 via an interconnect (for example, control signal line) other than the data line DQ.

If an error of data is detected by ECC processing (if the ECC pass check results in fail), the MRAM 10 according to this embodiment sets the signal level of the data line DQ0 out of the data unit rDU to "0" (step ST5A), as shown in FIGS. 5 and 6. The MRAM 10 according to this embodiment thus notifies the controller 900 that the ECC pass check results in fail.

On the other hand, if no error of data is detected (if the ECC pass check results in pass), the MRAM 10 according to this embodiment sets the signal level of the data line DQ0 "1" (step ST5B), as shown in FIGS. 5 and 7. The MRAM 10 according to this embodiment thus notifies the controller 900 that the ECC pass check results in pass.

The data unit rDU including the ECC pass check result rPC is output from the MRAM 10 to the controller 900 via the data line DQ next to the read data DU.

To control the issuance timing of the precharge command PRG, the controller 900 determines the ECC pass check result rPC notified by the MRAM 10 (step ST6). In this embodiment, the controller 900 determines whether the signal on the data line DQ0 included in the ECC pass check data rDU is "1" or "0".

After ECC processing, the MRAM 10 according to this embodiment determines the presence/absence of execution of write back processing based on the ECC processing check result rPC. If the ECC processing result rPC is fail, the MRAM 10 executes write back processing to correct the error of data DT in the memory area 21 (step ST6X). The data corrected by ECC processing is thus written at a predetermined address in the memory area 21.

Note that the write back processing is internal processing of the MRAM, and therefore, may be started before transmission of the ECC pass check result rPC, as shown in FIG. 6. For example, the write back processing may be executed as processing parallel to the transfer processing BTF to the output buffer and the serialization processing SRZ.

In this embodiment, when the data on the data line DQ0 is "0", the controller 900 issues the precharge command PRG to the MRAM 10 at a timing tPRG1 when the period (time) T1 from the reception (or transmission) of the read command RC has elapsed so as to ensure the period to execute the write back processing (step ST7A). When the write back processing is executed, issuance of the precharge command PRG and execution of the precharge operation are placed in a wait state.

When the data on the data line DQ0 is "1", neither an error of data nor correction exists. For this reason, the MRAM 10 can move up the precharge operation start timing and execute the precharge operation without executing write back processing.

The controller 900 issues the precharge command PRG to the MRAM 10 according to this embodiment at a timing tPRG2 when the period (time) T2 from the reception (or transmission) of the read command RC, which is shorter than the period T1, has elapsed without considering the period to execute the write back processing (step ST7B). When the write back processing is not executed, the controller 900 can transmit the precharge command PRG to the MRAM 10 at the timing tPRG2 earlier than in the case where the write back processing is executed.

The MRAM 10 according to this embodiment executes precharge of the interconnects WL, BL, and/or bBL in the memory area based on the precharge command PRG (step ST8).

For example, the precharge operation is designated by the leading edge of the clock when the precharge command PRG is input.

In the operation cycle of the MRAM 10, the precharge operation in the case where the ECC pass check results in fail (case where the write back processing is executed) starts at the timing when the period T1 has elapsed from the input of the read command.

In the operation cycle of the MRAM 10, the precharge operation in the case where the ECC pass check results in pass (case where the write back processing is not executed) starts after the period T2 (T2<T1) shorter than in the precharge operation in the case where the ECC pass check results in fail (case where the write back processing is executed).

Note that a delay time caused by an interconnect capacitance and the like may be included between the precharge command issuance timing (T1' or T2') of the controller 900 and the precharge start timing (T1 or T2) of the MRAM 10. In this embodiment, however, the command issuance timing and precharge start timing are regarded as substantially the same.

A period Tx from the start of the precharge operation to the end of the precharge operation is fixed regardless of the presence/absence of write back processing (pass/fail of ECC pass check).

The precharge operation start and execution timings may be controlled by a control signal generated in the MRAM 10 based on the result of ECC processing in place of the precharge command PRG from the controller 900.

As shown in FIGS. 6 and 7, after the elapse of a predetermined period Ty from the input of the precharge command PRG, the active command ACT is issued from the controller 900 to the MRAM 10. The period Ty from the reception (transmission) of the precharge command PRG to the reception (issuance) of the active command ACT is fixed regardless of the presence/absence of write back processing (pass/fail of ECC pass check).

In a state in which the interconnects BL, bBL, and/or WL are precharged, the MRAM 10 according to this embodiment waits until the controller 900 issues the next command.

As described above, the controller 900 issues the precharge command PRG to the MRAM 10 at a timing changeable according to the result of ECC processing. If no error is detected in data output from the memory area 21, the MRAM 10 starts the precharge operation at a timing earlier than in a case where an error is detected in the data output from the memory area 21 based on the command PRG.

As a result, the MRAM and the memory system according to this embodiment can shorten the operation cycle.

(c) Conclusion

In this embodiment, the controller 900 transmits, to the semiconductor memory (for example, MRAM) 10, the command PCC that causes the semiconductor memory 10 to notify the result of ECC processing.

Based on the command PCC, the semiconductor memory 10 notifies the controller 900 of the detection result (and the presence/absence of correction processing) rPC of an error of data output from the memory area (bank/memory cell) by ECC processing.

In this embodiment, the semiconductor memory 10 determines the presence/absence of execution of write back processing based on the data error detection result.

In addition, the controller 900 issues, to the semiconductor memory 10, the precharge command PRG at the timing tPRG1 or tPRG2 (T1 or T2) changeable according to the data error detection result (presence/absence of execution of write back processing).

In this embodiment, if no error exists in the data output from the memory area 21, the write back processing of the semiconductor memory 10 is not executed. For this reason, the controller 900 issues the precharge command PRG to the semiconductor memory 10 based on the determination of the presence or absence of the write back processing. Based on the precharge command PRG, the semiconductor memory 10 starts precharge of the bank BK after the period T2 shorter than the period (period set in consideration of the execution period of write back processing) T1 from the start of the read operation to the start of the precharge operation after write back processing.

The semiconductor memory 10 according to this embodiment can thus shorten the period from the start of data read to the start of precharge in the case where the write back processing is not executed as compared to the semiconductor memory 10 in which the precharge start timing is fixed regardless of the presence/absence of write back processing.

As a result, the semiconductor memory according to this embodiment and the system including the semiconductor memory can shorten the operation cycle.

When the semiconductor memory 10 is an MRAM, bank switching and precharge are performed frequently because the storage capacity of the bank of the MRAM is smaller than that of a DRAM. For this reason, decreasing the precharge wait time in the case where the write back processing is not executed, as in this embodiment, greatly contributes to improvement of the operation speed of the MRAM.

Hence, the semiconductor memory and the memory system according to this embodiment can implement an efficient operation.

(2) Second Embodiment

FIG. 8 will be referred to for a description of a semiconductor memory (for example, MRAM) according to the second embodiment. In the second embodiment, a description of substantially the same components, operations, and functions as in the first embodiment will be omitted. Note that FIGS. 1 to 7 will also be referred to as needed here.

An MRAM sometimes executes a scan of an address space (memory area), like a refresh operation, in a certain cycle in accordance with the standard used in the memory and/or the user specifications. By the scan operation of the address space executed in a certain cycle, the reliability of data stored in an MRAM 10 is ensured.

As in the MRAM and a memory system according to this embodiment, the necessity of execution of write back processing and the precharge start timing may be controlled based on the result of ECC processing for data output from a memory area 21 at the time of refresh operation.

FIG. 8 is a flowchart for explaining the operation of the MRAM and the memory system according to the second embodiment.

As shown in FIG. 8, a controller 900 issues a refresh command to the MRAM 10 at a certain timing (step ST100).

The refresh command is input to the MRAM 10, and the MRAM 10 starts the refresh operation (step ST101).

At the start of the refresh operation, the MRAM 10 sets a bank selected out of a plurality of banks to a bank having a first bank address (Bank=0) (step ST102).

After a bank BK as the target of the refresh operation is selected, the MRAM 10 sets a row selected out of a plurality of rows (word lines) to a row having a first row address (Row=0) (step ST103).

The row in the bank BK is activated by, for example, the MRAM 10 (step ST104). Data in the bank BK is output to a data latch circuit 26 at a timing according to the activation of the row (step ST105).

For example, the controller 900 issues an ECC pass check command PCC to the MRAM 10 as processing parallel to the internal processing of the MRAM 10 (step ST200). A control signal corresponding to the ECC pass check command PCC may be generated in the MRAM 10 in synchronism with input of the refresh command.

The MRAM 10 executes ECC processing in substantially the same manner as in the first embodiment, and checks the result (presence/absence of data error/correction) of ECC processing based on the ECC pass check command PCC (step ST106).

The ECC pass check result is determined (step ST107).

Determination of a check result rPC may be executed either by a control circuit 25 in the MRAM 10 or by the controller 900. For example, when the controller 900 determines the check result rPC, the ECC pass check result rPC is notified from the MRAM 10 to the controller 900 by setting data on a data line DQ0 to "0" or "1".

With the determination of the check result rPC by the MRAM 10, the presence/absence of execution of write back processing is determined.

If the ECC pass check result rPC is fail, write back processing is executed to write data that has undergone error correction in a memory cell MC (step ST107X). For example, in substantially the same manner as in the operation shown in FIG. 6, the start of the precharge operation waits until completion of write back processing in the refresh operation. On the other hand, when the ECC pass check result is pass, the write back processing is not executed.

After the determination of ECC pass check, the precharge operation in the MRAM 10 is executed (step ST108A or ST108B).

For example, the execution timing of the precharge operation is controlled by internal control of the MRAM 10 based on the ECC pass check result without transmission/reception of the precharge command. However, the execution timing of the precharge operation may be controlled by the precharge command issued by the controller 900 at a timing based on the ECC pass check result.

When write back processing is executed (the precharge operation is set in a wait state) as in step ST107X, precharge of interconnects BL, bBL, and/or WL is started and executed at a timing (time tPRG1) when a period T1 has elapsed from the start of refresh operation (for example, activation of the row) of the bank BK (memory area 21 or the selected row), in substantially the same manner as in the operation shown in FIG. 6 (step ST108A).

On the other hand, when the write back processing is not executed, precharge of the interconnects BL, bBL, and/or WL is started and executed at a timing (time tPRG2) when a period T2 (T2<T1) has elapsed from the start of refresh operation, in substantially the same manner in the operation shown in FIG. 7 (step ST108B).

At the time of the refresh operation, after the precharge of the wires BL, bBL, and WL in the selected bank is completed, address determination processing and internal generation processing in the MRAM 10 are executed.

MRAM 10 determines whether an address AR of the row selected to output data is the final row address in the selected bank BK (step ST109).

If the address value AR (Row) of the selected row is not a maximum value RowMax of the address value, increment processing (addition of 1 to the address value) for the current row address value is executed to generate a row address (Row+1) as the next operation target (step ST109X).

The row of the operation target is thus switched. Processes of steps ST104 to ST109 are sequentially executed up to the final row in the selected bank.

If the address value of the selected row is the maximum value RowMax of the row address in the bank, MRAM 10 notifies the controller 900 of completion of the refresh operation for one bank, and MRAM 10 determines whether the currently selected bank BK is the final bank in the plurality of banks BK (step ST110).

If an address value AB (Bank) of the currently selected bank BK is not a maximum value BankMax of the bank address AB, increment processing for the current bank address value is executed to generate a bank address (Bank+1) as the next operation target (step ST110X).

The bank BK of the operation target is thus switched. Processes of steps ST103 to ST110X are executed up to the final bank.

In the refresh operation, the memory space (memory area) is automatically scanned by internal generation processing of the row address and bank address in the MRAM 10 as in steps ST109, ST109X, ST110, and ST110X.

By processing parallel to the internal processing of the MRAM 10, the controller 900 monitors the state of internal processing of the MRAM 10.

The MRAM 10 notifies the controller 900 of status (result) of the refresh operation in the bank BK during the refresh operation so that the controller 900 is possible to check the progress of the refresh operation (step ST119).

For example, the respective statuses of the refresh operation in the banks BK are output to the controller 900 via the data lines DQ corresponding to the number (address) of each bank.

For example, MRAM 10 sets a signal level of the data line DQ corresponding to the bank where a scan (refresh operation) for all of the rows has been completed to "1(H)" level in the step ST119.

For example, the controller 900 monitors the statuses (signal levels of the data lines DQ) output from the MRAM 10 in step ST119 based on steps ST109 and ST110 of the internal processing of the MRAM 10 (step ST201). The controller 900 determines whether the refresh operation of the MRAM 10 has been completed or not based on the monitoring of the statuses (step ST202).

The controller 900 issues the pass check command (and precharge command) to the MRAM 10 at a predetermined timing based on the determination result of the status of each bank.

Note that issuance of the pass check command PCC from the controller 900 to the MRAM 10 may be done only once at the start of the refresh operation. The ECC pass check may be executed at a predetermined timing by keeping the held state of the pass check command PCC in the MRAM 10 during the period of the refresh operation.

When internal data read, ECC processing, and write back processing for the final bank BK end, the refresh operation of the MRAM 10 is completed (step ST300).

Furthermore, a refresh operation may be executed for the only one bank by a refresh command without simultaneously executing the refresh operations for a plurality of banks by the refresh command.

In this case, the controller 900 transmits a refresh command which indicates execution of a refresh operation for the only one bank to the MRAM 10.

The MRAM 10 executes processes from the step ST101 to step ST 109 (and ST 109X) of FIG. 8 based on the command.

After a scan for all of the rows of the selected bank has been completed, the MRAM 10 finishes the refresh operation of the bank without the determination (step ST110) and the increment (step ST110X) of address of the bank.

In the case that the only one bank is selected as a target for the refresh operation, the refresh operation for each bank may be executed in the order of addresses of banks depending on the refresh commands sequentially issued at some cycle or may be executed in random depending on a circumstance of an operation of MRAM 10.

The reliability of data stored in the MRAM 10 is ensured by the scan of data in the automatically decided address space, as in the refresh operation of the MRAM 10 according to this embodiment.

As described above, the MRAM that executes a scan (for example, refresh operation) of the address space as in this embodiment can execute the precharge operation without a wait period ensured for write back processing as the result of omitting the write back processing in the case where no error of data is detected at the time of the scan operation.

As a result, the MRAM according to this embodiment can shorten the period for the scan operation.

As described above, the semiconductor memory according to the second embodiment and the system including the semiconductor memory can implement an efficient operation.

(3) Third Embodiment

FIG. 9 will be referred to for a description of a semiconductor memory (for example, MRAM) and a memory system according to the third embodiment. In the third embodiment, a description of substantially the same components, operations, and functions as in the first and second embodiments will be omitted.

A command CMD may include a control signal used to control ECC pass check.

For example, in an MRAM 10 and a controller 900 according to this embodiment, the command CMD based on a certain standard (for example, JEDEC standard) includes an RFU (Reserve for Future Use) bit.

FIG. 9 is a view showing an example of the arrangement of various kinds of signals included in a command according to this embodiment.

As shown in FIG. 9, a read command RC, a bank address AB, and a column address AC are transmitted from the controller 900 to the MRAM 10 via pins (for example, CA pins) Pin0 to Pin9 provided in an interface 13. Referring to FIG. 9, there is a pin (RFU pin) not to be used to transmit/receive the command (control signal) and the addresses AB and AC.

A signal (to be referred to as an ECC pass check control signal hereinafter) sPC indicating substantially the same control as an ECC pass check command CC is assigned to the RFU pin/bit.

The command RC thus includes a control signal representing a read request and the control signal sPC representing ECC pass check.

The controller 900 issues the read command RC to the MRAM 10. The MRAM 10 executes data read and executes ECC pass check based on the ECC pass check control signal sPC in the read command RC.

In the operation example shown in FIG. 6 or 7, the read command RC including the ECC pass check control signal sPC is issued from the controller 900 to the MRAM 10.

For example, when the ECC pass check control signal sPC is "H", the MRAM 10 executes ECC pass check based on the ECC pass check control signal sPC without input of an ECC pass check command independent of the read command. Based on the ECC pass check control signal sPC of "H" level, the MRAM 10 notifies the controller 900 of a result (presence/absence of an error) rPC of ECC processing.

In substantially the same manner as in the operation shown in FIG. 6 or 7, the controller 900 issues a precharge command PRG to the MRAM 10 at a timing changeable according to the ECC pass check result rPC. The MRAM 10 starts and executes precharge at a timing according to reception of the precharge command PRG.

For example, when the ECC pass check control signal sPC is "L", the MRAM 10 does not execute ECC pass check. In this case, the controller 900 issues the precharge command PRG at a fixed timing (for example, at the timing after the elapse of a period T1) independently of the presence/absence of write back processing of the MRAM 10. Based on the precharge command PRG supplied at the fixed timing, the MRAM 10 executes the precharge operation at a timing at which the operation margin with respect to write back processing is ensured.

In some cases, the command issuance count of the controller is preferably reduced or the number of commands defined between the semiconductor memory and the controller is preferably small to improve the operation speed and the operation efficiency of the memory system and decrease the load on the controller. Also in some cases, the write back function of the MRAM is turned off, and the MRAM is controlled always not to execute the write back processing in accordance with the user specifications.

When the command CMD (for example, read command) from the controller 900 includes the control signal sPC of ECC pass check processing, as in this embodiment, the count of the operation of the controller 900 to issue the command for the ECC pass check operation can be reduced.

In this embodiment, the operation timings of the MRAM 10 and the controller 900 can be controlled without considering the timings of ECC pass check command generation and transmission/reception and the processing margin.

As a result, the MRAM according to this embodiment and the memory system including the MRAM can implement efficient control of the controller and the MRAM.

In the MRAM whose specifications prohibit execution of write back processing, control of the precharge operation based on the ECC pass check result need not always be executed. The MRAM according to this embodiment can cope with the change in the specifications merely by changing the signal level of the signal in the command. For this reason, the MRAM according to this embodiment can improve the flexibility in coping with changes in the memory specifications.

As described above, the MRAM and the memory system according to this embodiment can implement an efficient operation.

(4) Fourth Embodiment

Figure 10:
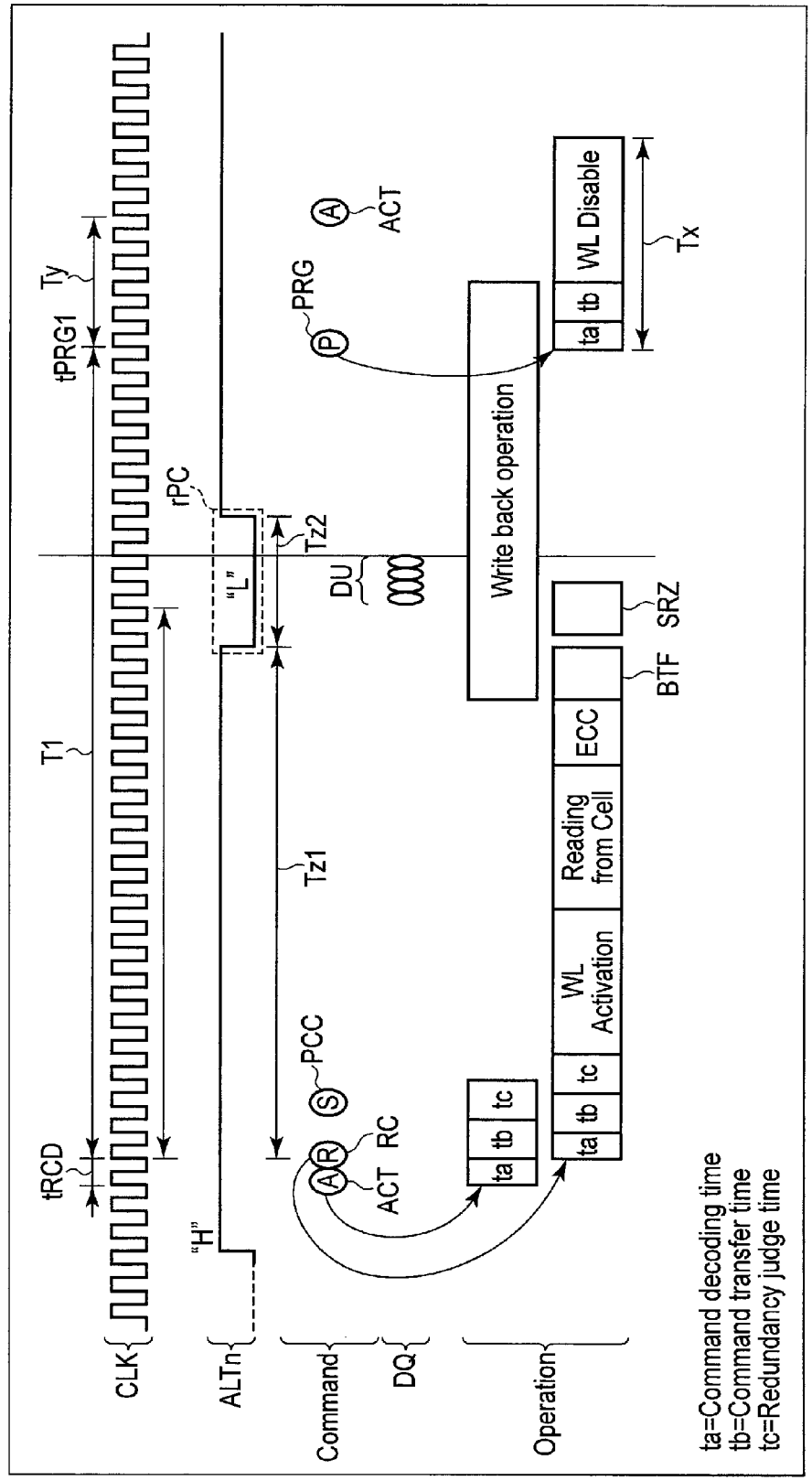
FIG. 10 is a timing chart for explaining an example of the operation of a semiconductor memory according to the fourth embodiment.

FIGS. 10 to 12 will be referred to for a description of a semiconductor memory (for example, MRAM) according to the fourth embodiment. In the fourth embodiment, a description of substantially the same components, operations, and functions as in the first to third embodiments will be omitted.

The ECC pass check operation and the precharge operation of the MRAM may be controlled by control signals independent of commands.

For example, when the MRAM is driven based on a certain standard (for example, JEDEC memory standard), an ALERT_n signal (alert signal) is supplied to an MRAM 10 as a control signal. The ALERT_n signal is transmitted/received between the MRAM 10 and a controller 900 by the pins (control signal lines) of the MRAM 10 and the controller 900. The ALERT_n signal is a multifunctional signal to be used as an error flag or the like.

The result of ECC pass check processing may be reflected on the ALERT_n signal. For example, the ALERT_n signal set to the "L" level indicates that the ECC pass check result is fail. The ALERT_n signal set to the "H" level indicates that the ECC pass check result is pass.

FIG. 10 is a timing chart showing an example of the internal operation of the MRAM according to this embodiment when the ECC pass check result is fail.

As shown in FIG. 10, when an ECC pass check result rPC is fail after ECC processing, an ALERT_n signal ALTn is set to the "L" level. For example, a control circuit 25 changes the signal level of the ALERT_n signal ALTn from the "H" level to the "L" level at a timing when a predetermined period Tz1 has elapsed from the input of a read command RC.

By the ALERT_n signal ALTn of "L" level, the controller 900 detects that the ECC pass check result rPC is fail, and a write back processing is to be executed.

The controller 900 issues a precharge command PRG to the MRAM 10 at a timing considering the execution period of write back processing.

After the write back processing, the MRAM 10 according to this embodiment receives the precharge command PRG and executes precharge of interconnects BL, bBL, and WL at a timing tPRG1 when a period T1 has elapsed from the input of the read command RC.

Note that the ALERT_n signal ALTn transits from "L" level to "H" level at a timing when a period Tz2 for the controller 900 to detect the signal of "L" level is ensured.

FIG. 11 is a timing chart showing an example of the operation of the MRAM according to this embodiment when the ECC pass check result rPC is pass.

As shown in FIG. 11, when an ECC pass check result rPC is pass after ECC processing, the ALERT_n signal ALTn is set to "H" level. For example, the control circuit 25 maintains the signal level of the ALERT_n signal ALTn at "H" level.

By the ALERT_n signal ALTn of "H" level, the controller 900 detects that the ECC pass check result rPC is pass, and write back processing is not to be executed.

After detecting the ALERT_n signal ALTn of "H" level, the controller 900 issues the precharge command PRG to the MRAM 10 at a timing tPRG2 when a period T2 (<T1) has elapsed from the input of the read command RC.

When the ECC pass check results in pass (when no error in data is detected), the MRAM 10 according to this embodiment receives the precharge command PRG and executes precharge of the interconnects BL, bBL, and/or WL at a timing earlier than in the case where the write back processing is executed, as in the above-described embodiments.

In this embodiment, check of ECC processing in the MRAM 10 may be executed without transmission/reception of an ECC pass check command PCC.

Note that in the embodiments, when the write back processing is not executed, the precharge operation may be executed following ECC processing. In this case, the precharge operation is started, for example, at the timing when the period Tz1 has elapsed, and executed as processing parallel to transfer processing BTF to the output buffer and serialization processing SRZ.

FIG. 12 is a schematic view showing a modification of the system including the semiconductor memory according to this embodiment.

In this embodiment, an example has been described in which an existing control signal (pin) based on the standard of the semiconductor memory is used to transmit/receive the ECC pass check result.

However, the memory system including the MRAM 10 and the controller 900 may use a new control signal sPC and an external connection terminal (pin or pad) pPC to transmit/receive the ECC pass check result, as shown in FIG. 12.

As described above, the MRAM 10 according to this embodiment can notify the controller 900 of the ECC pass check result rPC by the control signal (control line) between the MRAM 10 and the controller 900.

The semiconductor memory and the memory system according to this embodiment can thus improve the operation speed and the operation efficiency of the memory system.

The semiconductor memory and the memory system according to this embodiment can decrease the load on the controller.

In addition, the semiconductor memory and the memory system according to this embodiment can improve the flexibility to changes in the specifications of the semiconductor memory.

(5) Others

In the above-described embodiments, the MRAM has been exemplified as the semiconductor memory. However, the semiconductor memory according to each embodiment is not limited to the MRAM. The embodiments may be applied to any other semiconductor memory such as an SRAM, DRAM, ReRAM, or PCRAM as long as the semiconductor memory executes precharge of wires after ECC processing and write back processing (data rewrite).

The standard applied to the semiconductor memory according to each embodiment is not limited to the JEDEC memory standard. The semiconductor memory according to each embodiment may be a memory that is not based on any specific standard.

As for the semiconductor memory according to each embodiment, an example has been described in which determining the necessity of write back processing and changing the timing of precharge processing are executed based on the error detection result of ECC processing at the time of data read.

However, the semiconductor memory and the memory system according to each embodiment may execute determining the necessity of data rewrite processing and changing the timing of precharge start based on a verify detection result at the time of data write.

In the embodiments, the ECC circuit (ECC function) may be provided not on the semiconductor memory 10 but in the controller 900. In accordance with the result of ECC processing of the controller 900, the presence/absence of execution of write back processing of the semiconductor memory (for example, MRAM) and the precharge timing may be controlled as described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
a memory area;
an error detection circuit which detect an error of first data output from the memory area; and
a control circuit which control operations of the memory area and the error detection circuit,
wherein when the error is detected in the first data, the control circuit starts precharge of a bit line of the memory area at a timing when a first period has elapsed from a start of a first operation of the memory area for output of the first data, and
when the error is not detected in the first data, the control circuit starts the precharge at a timing when a second period has elapsed from the start of the first operation, the second period is shorter than the first period.

2. The memory according to claim 1, wherein
when the error is detected in the first data, the control circuit executes, before the precharge, first processing for writing second data obtained by correcting the error in the first data,
when the error is not detected in the first data, the control circuit starts the precharge without executing the first processing.

3. The memory according to claim 1, wherein
the first data is output from the memory area based on a first command from an outside device, when the error is detected in the first data, the control circuit receives a second command representing execution of the precharge from the outside device in synchronism with the elapse of the first period from input of the first command, and when the error is not detected in the first data, the control circuit receives the second command from the outside device in synchronism with the elapse of the second period from the input of the first command.

4. The memory according to claim 1, wherein
the control circuit receives, from a host device, a third command that requests to notify the outside device of a detection result of the error of the first data.

5. The memory according to claim 4, wherein
the control circuit includes a first circuit to analyze the third command and perform control to notify the outside device of the detection result.

6. The memory according to claim 1, wherein
when the error is detected in the first data, the control circuit sets a signal level of a data line coupled with an outside device to a first signal level, and when the error is not detected in the first data, the control circuit sets the signal level of the data line to a second signal level different from the first signal level.

7. The memory according to claim 1, wherein
the first data is output from the memory area based on a first command from an outside device,
the first command includes a first control signal that controls notification of a detection result of the error of the first data.

8. The memory according to claim 1, wherein
when the error is detected in the first data, the control circuit sets a signal level of a first control signal to a first level and controls a timing of starting the precharge, and when the error is not detected in the first data, the control circuit sets the signal level of the first control signal to a second level different from the first level and controls the timing of starting the precharge.

9. The memory according to claim 1, wherein
the first data is output from the memory area based on a first command from an outside device,
the first command is one of a command that instructs read of data and a command that instructs a scan operation in the memory area.

10. The memory according to claim 1, wherein
the memory area includes a magnetoresistive element as a memory element.

11. A memory system comprising:
a semiconductor memory including a memory area to store first data and an error detection circuit to detect an error of the first data; and
a controller that instructs output of the first data from the memory area and precharge of a bit line of the memory area to the semiconductor memory and receive a detection result of the error of the first data from the semiconductor memory,
wherein the semiconductor memory determines presence/absence of the error of the first data at the output of the first data,
when the error of the first data is detected, the controller instructs the precharge to the semiconductor memory in a first period from a start of a first operation of the semiconductor memory for the output of the first data,
when the error of the data is not detected, the controller instructs the precharge to the semiconductor memory in a second period from the start of the first operation, the second period is shorter than the first period.

12. The system according to claim 11, wherein
when the error is detected in the first data, the semiconductor memory executes, before the precharge, a first processing for writing second data corrected the error in the first data,
when the error is not detected in the first data, the semiconductor memory executes the precharge without executing the first processing.

13. The system according to claim 11, wherein
the controller transmits, to the semiconductor memory, a first command that instructs the output of the first data, a second command that instructs the precharge and a third command that instructs notification of the detection result of the error of the first data,
the controller transmits the third command to the semiconductor memory before transmission of the second command.

14. The system according to claim 11, wherein
the detection result is transmitted to the controller via a data line used for transfer of data between the semiconductor memory and the controller.

15. The system according to claim 11, wherein
the controller transmits a first command that instructs the output of the first data to the semiconductor memory,
the first command includes a first control signal that instructs notification of the detection result.

16. The system according to claim 11, further comprising:
a control line provided between the semiconductor memory and the controller, the control line to which a second control signal used to notify the detection result is supplied,
wherein when the error is detected in the first data, the semiconductor memory sets a signal level of the second control signal to a first signal level, and
when the error is not detected in the first data, the semiconductor memory sets the signal level of the second control signal to a second signal level different from the first signal level.

17. The system according to claim 11, wherein
the controller transmits a first command that instructs the output of the first data to the semiconductor memory,
the first command is one of a command that requests read of data and a command that requests scan of an address space of the semiconductor memory.

18. A method of controlling a semiconductor memory comprising:
outputting first data from a memory area;
detecting an error of the first data output from the memory area; and
executing precharge of a bit line of the memory area at a timing when a first period has elapsed from a start of a first operation of the memory area for output of the first data, when the error is detected in the first data; and
executing the precharge at a timing when a second period has elapsed from the start of the first operation, when the error is not detected in the first data, the second period shorter than the first period.

19. The method according to claim 18, further comprising:
writing second data corrected the error in the first data in the memory area before the precharge, when the error is detected in the first data; and
executing the precharge without the writing of the second data when the error is not detected in the first data.

20. The method according to claim 18, further comprising:
   notifying a detection result of the error of the first data to an outside device, to start the precharge based on a command from the outside device.

* * * * *